United States Patent [19]
Manning

[11] Patent Number: 5,872,056
[45] Date of Patent: Feb. 16, 1999

[54] SEMICONDUCTOR PROCESSING METHODS OF FORMING SELF-ALIGNED CONTACT OPENINGS

[75] Inventor: H. Montgomery Manning, Kuna, Id.

[73] Assignee: Micron Technology, Inc., Boise, Id.

[21] Appl. No.: 797,499

[22] Filed: Feb. 7, 1997

[51] Int. Cl.⁶ .................................................. H01L 21/44
[52] U.S. Cl. ...................... 438/637; 438/638; 438/639; 438/666; 438/700
[58] Field of Search .................................. 438/637, 638, 438/666, 700, 639, 725

[56] References Cited

U.S. PATENT DOCUMENTS 5,198,386  3/1993  Gonzalez ................................. 437/52
5,286,344  2/1994  Blalock et al. .
5,286,674  2/1994  Roth et al. .
5,451,543  9/1995  Woo et al. .
5,702,981  12/1997  Maniar et al. .

Primary Examiner—Caridad Everhart
Attorney, Agent, or Firm—Wells, St. John, Roberts, Gregory & Matkin, P.S.

[57] ABSTRACT

Semiconductor methods of forming self-aligned contact openings are described. In a preferred implementation, a conductor is formed over a substrate. A first layer of material is formed over the conductor. A second layer of material is formed over the first layer of material. The first and second layer materials can be etchably different. Portions of the first and second layers are then removed to form a contact opening to the conductor. According to one aspect, the second layer material is removed at a slower rate than the rate at which first layer material is removed. According to another aspect, portions of such layers are removed at the same time. According to still another aspect of the invention, the second layer material comprises a sacrificial spun-on material.

40 Claims, 5 Drawing Sheets

SEMICONDUCTOR PROCESSING METHODS OF FORMING SELF-ALIGNED CONTACT OPENINGS

TECHNICAL FIELD

This invention relates to semiconductor processing methods of forming contact openings.

BACKGROUND OF THE INVENTION

One aspect of semiconductor processing involves making contact to or electrical connection with integrated circuitry devices, such as conductors or conductive lines which underlie one or more layers of material provided over a substrate. One prior art method of making such connection utilizes contact pads. These are enlarged conductive areas which are typically rectangular or square in shape and operably connected with the integrated circuitry device with which electrical connection is desired. The enlarged pad area provides a degree of tolerance for mask misalignment to still achieve the desired contact without causing an electrical short with other adjacent circuitry. The larger contact pad areas, however, consume valuable wafer surface area which could desirably be used for additional circuitry.

The problem is exemplified in FIG. 1, where a portion of an integrated circuit is indicated generally at 10. Integrated circuit 10 comprises a substrate 11 atop which a conductor 12 is formed. An insulative layer 13 is provided over conductor 12 and corresponding substrate surface area adjacent the conductor. A contact opening 14 of a minimum desired dimension is formed through a photoresist layer 19, but because it is slightly misaligned to the left, a corresponding portion of insulative layer 13 directly overlying substrate 11 is undesirably removed. Such can also result in etching into substrate 11, as shown.

One prior art proposed solution is set forth in FIGS. 2 and 3. There, a portion of integrated circuitry 10a includes an insulative or semiconductive substrate 11 having an enlarged contact pad 15 formed thereon. A conductive line 16 is formed over substrate 11 and connects with contact pad 15. The goal is ultimately to make electrical connection with line 16.

An insulative layer 17 is formed over contact pad 15. A contact opening 18 is targeted to be etched to contact pad 15. As shown, contact pad 15 is made considerably larger than the resultant contact opening 18 to provide a tolerance for contact mask misalignment. As an example, two representative contact mask misalignments are shown (FIG. 2). A first contact mask misalignment is shown in dashed lines at 20 and represents a lateral and rotational displacement of the contact opening from the desired central location shown in solid lines. A second contact mask misalignment is shown in dash-dot lines at 22 and represents a simple misplacement in the negative x-direction. Either way, the contact opening falls within the boundary of the contact pad and the desired electrical connection is made. Accordingly, the wider-dimensioned contact pad tolerates mask misalignments, but at the expense of consuming precious wafer real estate.

This invention grew out of concerns associated with conserving wafer space or area. This invention also grew out of concerns associated with reducing or decreasing the area required for a contact pad.

SUMMARY OF THE INVENTION

Semiconductor methods of forming self-aligned contact openings are described. In a preferred implementation, a conductor is formed over a substrate. A first layer of material is formed over the conductor. A second layer of material is formed over the first layer of material. The first and second layer materials can be etchably different. Portions of the first and second layers are then removed to form a contact opening to the conductor. According to one aspect, the second layer material is removed at a slower rate than the rate at which first layer material is removed. According to another aspect, portions of such layers are removed at the same time. According to still another aspect of the invention, the second layer material comprises a sacrificial spun-on material.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 4:
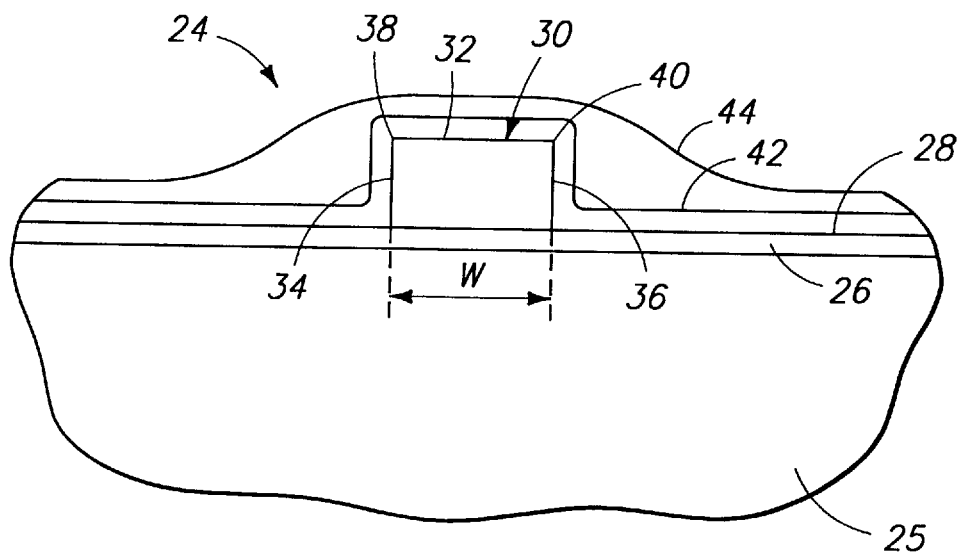
FIG. 4 is a diagrammatic sectional view of a semiconductor wafer fragment at one processing step in accordance with the invention.

Referring to FIG. 4, a conductor assembly to which electrical connection is to be made is indicated generally at 24. The illustrated conductor assembly 24 comprises a semiconductive substrate 25, such as a bulk silicon substrate, and a substrate insulator or insulative layer of material 26. Substrate insulator or insulative layer of material 26 typically constitutes a thin oxide material which is formed over the semiconductive substrate. Material layer 26 includes a substrate outer surface 28. Other substrate constructions are possible. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A conductive structure 30 is formed over substrate outer surface 28 and includes at least one abrupt topological feature relative to a laterally spaced adjacent substrate surface. In the illustrated and preferred embodiment, conductive structure 30 comprises one or more polysilicon or polycide layers, with such layers being typically formed elevationally over and in close proximity with other conductors or devices. It is desirable when forming an electrical connection with conductive structure 30, to avoid making electrical connection with other conductors or devices elevationally thereunder. In the illustrated example, such other conductors or devices (not specifically shown) would typically underlie material layer 26. Conductive structure 30 includes a planar outer surface 32 which is generally elevated relative to immediately laterally adjacent substrate surface 28. Conductive structure 30 includes two abrupt topological features in the form of sidewalls or sidewall edges 34, 36 which extend between outer surface 32 and adjacent substrate surface 28. Such supports surface area 32 elevationally outwardly of substrate outer surface area 28. Topological features other than the illustrated sidewalls are of course possible.

Sidewalls 34, 36 constitute conductive surfaces which extend generally outwardly of and away from the laterally adjacent substrate surface. Outer surface 32 accordingly defines a preferably planar conductor target surface having two sidewalls 34 and 36 joined therewith at edges 38 and 40, and which extend preferably transversely away therefrom toward the adjacent substrate surface 28. Outer surface 32 is thereby disposed between edges 38 and 40. Sidewalls 34 and 36 constitute conductor surfaces (other than surface 32) which are elevationally below edges 38, 40. Conductor 30 defines a width dimension W in a width dimension direction which lies in the plane of the page and between edges 38, 40.

A first layer 42 is formed over conductor 30 and adjacent substrate outer surface 28. Layer 42 preferably covers the conductor and is insulative or dielectric in nature, forming a unitary and generally conformal insulative material layer over the conductor. Layer 42 need not, however, be conformal. Preferably, first layer 42 is formed to an elevational thickness over the conductor outer surface area 32 of from about 50 Angstroms to about 5000 Angstroms. Example materials for first layer 42 include doped or undoped $SiO_2$, $Si_3N_4$, $Al_2O_3$, TiO, a layer which is formed from decomposition of tetraethyl orthosilicate (TEOS), and the like.

A second layer 44 is formed over first layer 42. Second layer 44 has a non-uniform elevational thickness relative to first layer 42. Accordingly in the illustrated and preferred embodiment, second layer 44 takes on the appearance of a mound of material which is formed over conductor 30 and layer 42. Preferably, second layer 44 is formed or mounded over first layer 42 and conductor 30 by spin coating the second layer onto substrate 26. Accordingly, the second layer of material accumulates to a thicker degree in the vicinity of sidewalls 34, 36 and the portions of first layer 42 thereadjacent. Such provides a second layer which has a variable elevational thickness relative to the underlying dielectric material layer 42. Such is effectuated at least in part by the abrupt topology of the conductor sidewalls 34, 36 which serves to enable a desired amount of second layer material to accumulate thereover when applied in the preferred manner. Accordingly, second layer 44 is generally non-conformal and has a varying elevational thickness relative to substrate surface 28. Layer 44 is preferably thinner elevationally outward of outer surface 32 and thicker laterally adjacent conductor 30. In a preferred implementation, layer 44 tapers generally toward the substrate surface as the layer extends laterally outward of sidewalls 34, 36.

Example materials for layer 44 include spin-on-glass, polyimide and bottom anti-reflective coating (BARC) materials such as 0.65 $\mu$m grade AZ Barli. Accordingly, layers 42 and 44 comprise two layers which are formed over conductor 30 and which are different from one another, with a first of the layers ideally being an insulative or dielectric material and a second of the layers ideally comprising a BARC material.

Figure 5:
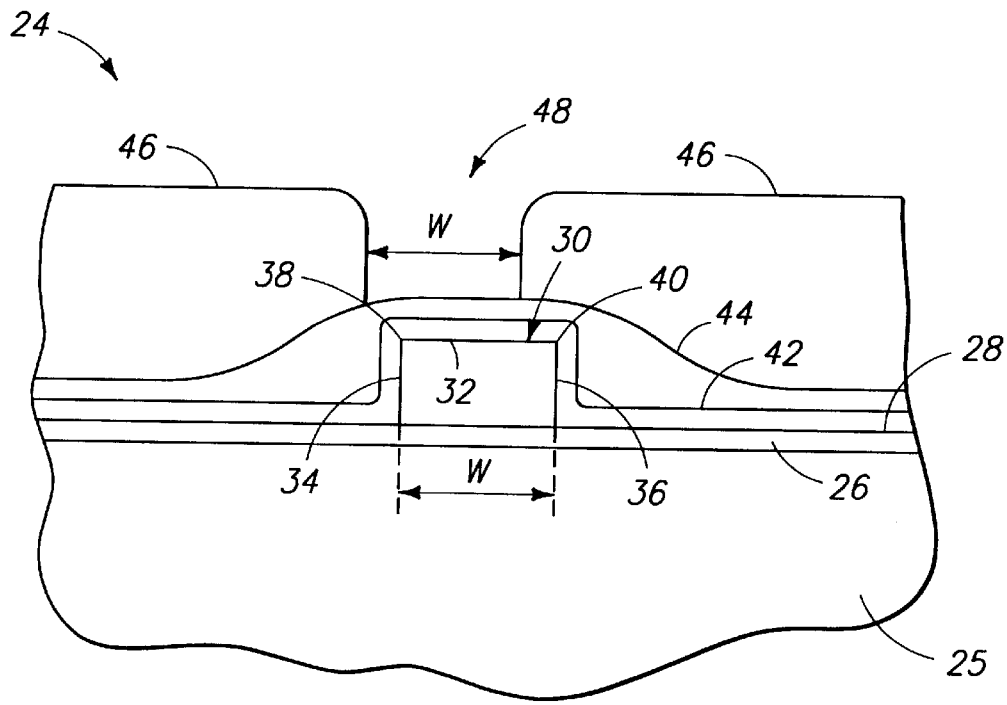
FIG. 5 is a view of the FIG. 4 wafer fragment at a processing step subsequent to that shown in FIG. 4.

Referring to FIG. 5, a layer of photoresist 46 is deposited and patterned to define a mask opening 48 having a lateral width dimension W which, in the illustrated example, is the same size and in the same width dimension direction of the conductor's width dimension W. The mask opening lateral width dimension can, however, vary in width dimension relative to the conductor's width dimension. As shown, mask opening 48 is misaligned to the left relative to target surface 32 of underlying conductor 30. Such would, in the prior art, typically cause the resultant contact etch to short to layers underlying the substrate because the etch would extend over the boundary of the conductor.

Figure 6:
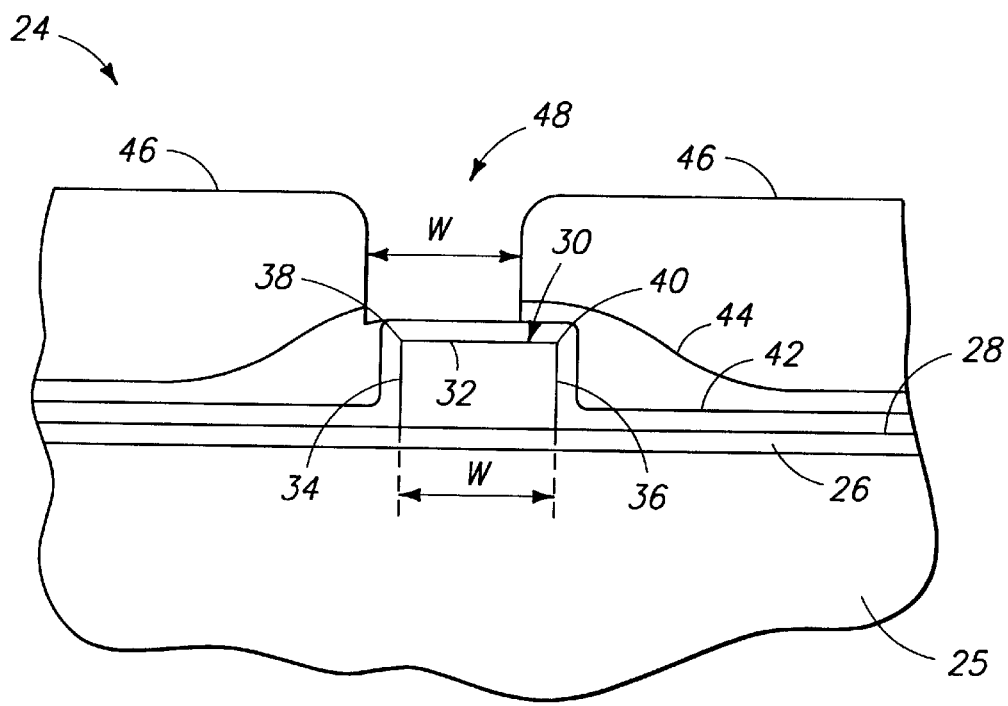
FIG. 6 is a view of the FIG. 4 wafer fragment at a processing step subsequent to that shown in FIG. 5.
Figure 7:
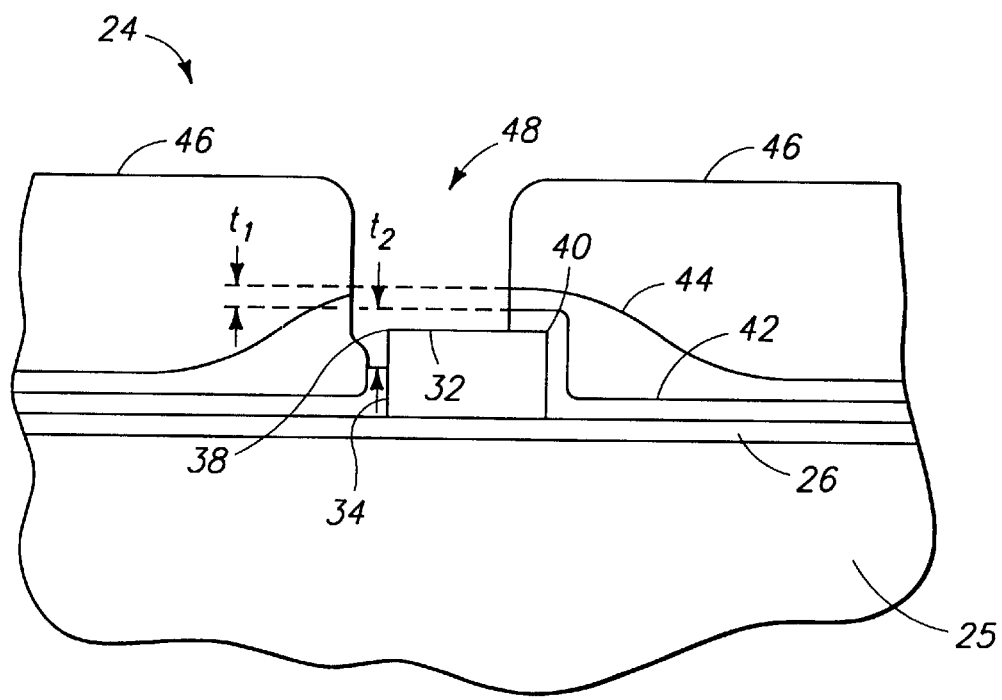
FIG. 7 is a view of the FIG. 4 wafer fragment at a processing step subsequent to that shown in FIG. 6.

Referring to both FIGS. 6 and 7, mask opening 48 becomes contact opening 48 through layers 42, 44 to conductor outer target surface 32. In a preferred implementation, second layer material 44 is etched or otherwise removed at a slower rate than the rate at which first layer material 42 is removed. Such is evident from FIG. 7 where $t_1$ illustrates the removed portion of second layer 44 and $t_2$ illustrates the removed portion of first layer 42. For example, at the beginning of the etch, only portions of layer 44 are removed. Such corresponds to the FIG. 6 construction. Upon outward exposure of underlying layer 42 material, such material begins to be cleared over outer surface 32 (FIG. 7). In the illustrated example, as layer 42 material is cleared from atop outer surface 32, layer 44 material continues to be removed. Upon outward expose of outer surface 32 and sufficient over etch, the etching is terminated. As shown, layer 44 material is thicker along sidewall 34 and accordingly, the etch does not reach the substrate surface. Such enables a contact mask to be misaligned without having to provide a larger contact pad area to accommodate the same. This is because the material of layers formed adjacent conductor 30 are etched in a manner which prevents shorting to the substrate surface located immediately elevationally therebelow.

Ideally, portions of first and second layers 42 and 44 are removed through at least one anisotropic etch which forms contact opening 48 over conductor outer surface 32. Preferably, a singular anisotropic etching step is utilized using a common etch chemistry, in going from the FIG. 5 to the FIG. 7 construction. With the preferred materials in mind (oxide material for layer 42 and an organic BARC material for layer 44) a suitable etch chemistry includes the following parameters in an Applied Materials AME 5000 processor: $CF_4$ 20 sccm, $CHF_3$ 40 sccm, Ar 80 sccm, 100 Gauss, 600 Watts, electrode temperature of 20° C., and reactor pressure of 200 mT, with the time parameter being dependent upon the thickness of the films being etched.

Alternately, multiple etching steps and chemistries can be utilized, particularly where additional layers beyond layers 42 and 44 are utilized. For example, a first etch chemistry can be utilized for layer 44 which may or may not be selective to underlying layer 42. A secondary etch chemistry could then be used to etch layer 42 faster than the material comprising layer 44. An example chemistry for the secondary etch would be that described above. In this case, layer 44 material would be etched in the first step for a time sufficient to remove it from over outer surface 32, but not completely remove it from adjacent the conductor's sidewall(s).

Figure 1:
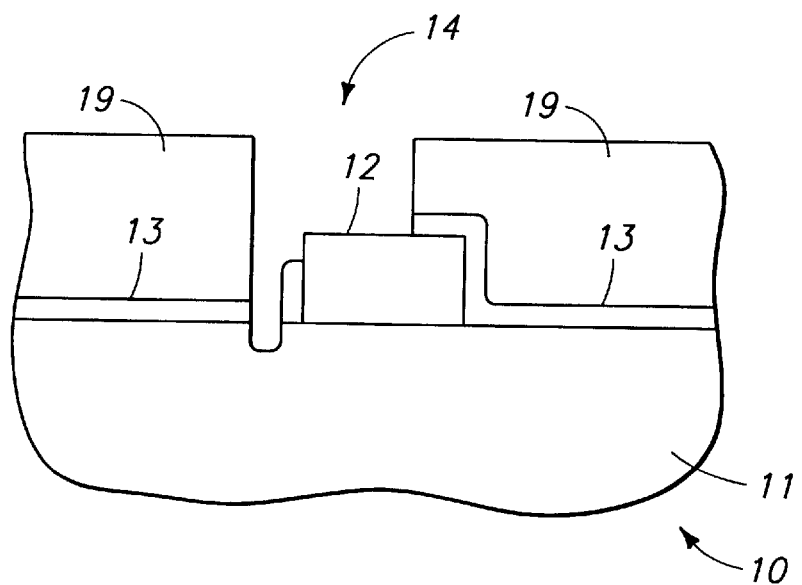
FIG. 1 is a diagrammatic view of a prior art contact opening and is discussed in the "Background of the Invention" section.
Figure 2:
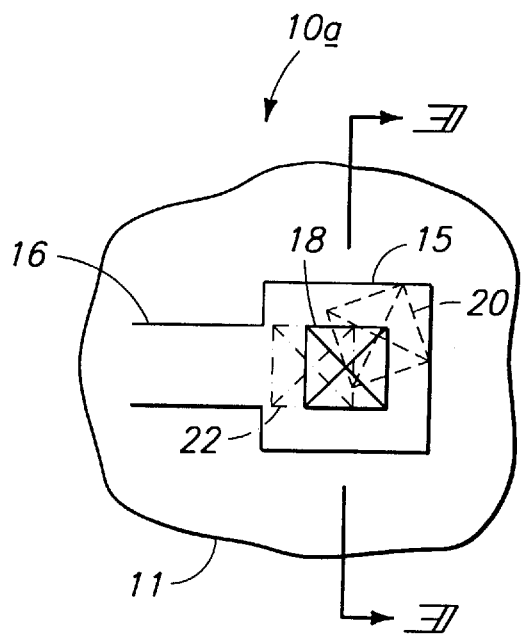
FIG. 2 is a diagrammatic view of a prior art contact pad and is discussed in the "Background of the Invention" section.
Figure 3:
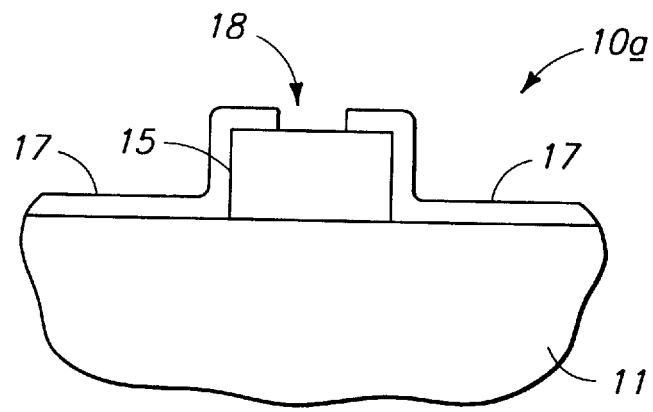
FIG. 3 is a view taken along line 3—3 in FIG. 2.

Accordingly, the need for an over-sized contact pad, such as contact pad 15 in FIGS. 2 and 3 is reduced if not eliminated. The preferred BARC material has an additional advantage insofar as its light scattering properties are concerned. Specifically, during photoresist exposure a degree of light reflecting from the underlying layers occurs which can enlarge the contact opening. The preferred BARC material reduces light reflectance which, in turn, serves to maintain a desired contact opening width. When the contact mask is misaligned over the sidewalls where the BARC material is thicker, an additional reduction in reflectance occurs, thereby reducing the dimension of the contact opening by pulling back the overlapped edge. This helps to reduce the effective misalignment of the overlapped edge.

Figure 8:
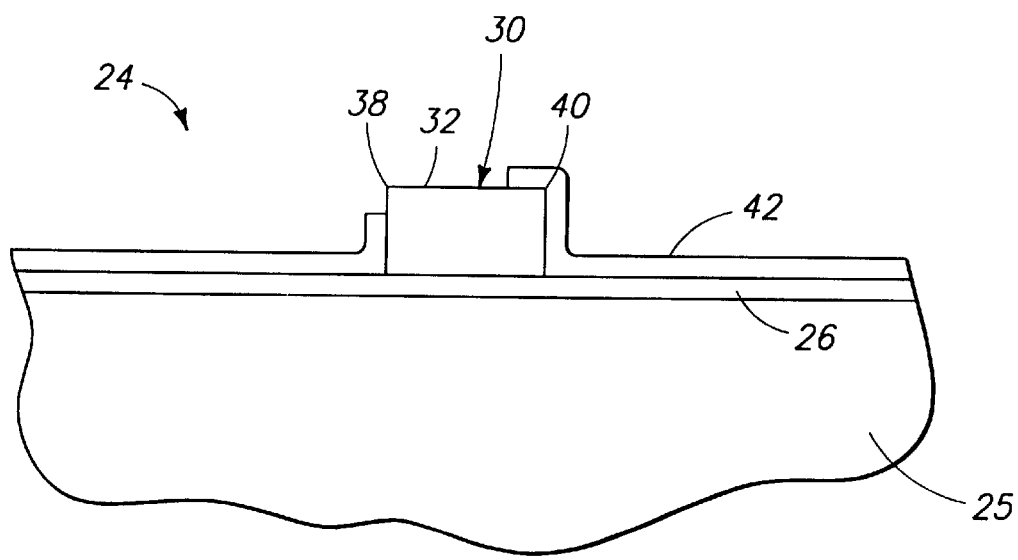
FIG. 8 is a view of the FIG. 4 wafer fragment at a processing step subsequent to that shown in FIG. 7.
Figure 9:
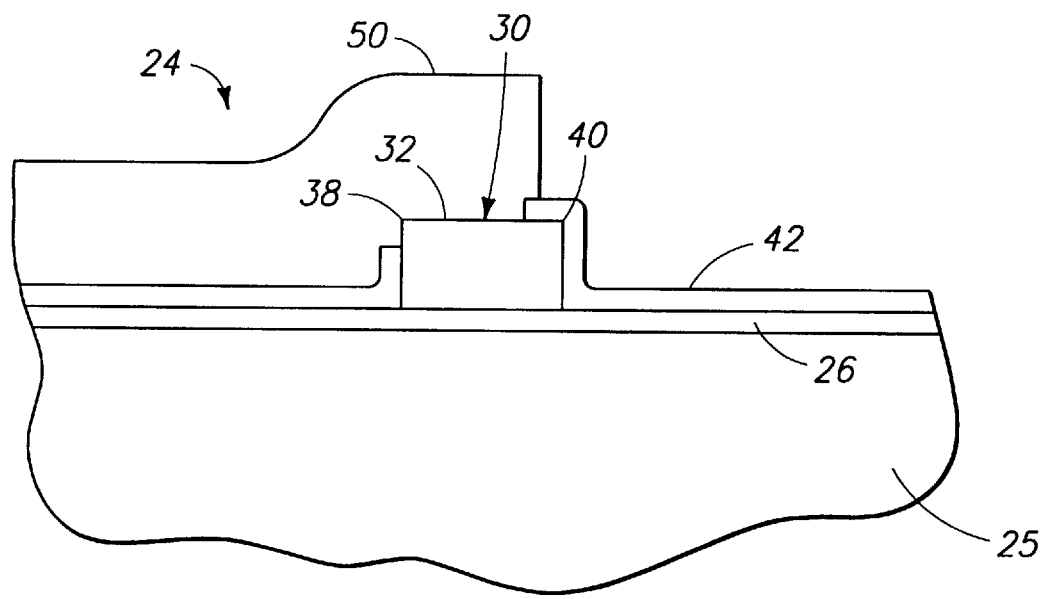
FIG. 9 is a view of the FIG. 4 wafer fragment at a processing step subsequent to that shown in FIG. 8.

The illustrated etch results in a portion of the conductor surface of sidewall 34 which is elevationally below edge 38 being exposed such that electrical connection can be made thereto. At least due to the illustrated mask misalignment, this results in removing first and second layer portions at the same time, with second layer material being removed at a slower rate than first layer material. In this manner, the conductor is cleared of overlying insulator before layer 44 can be cleared along the sidewalls of the conductor. This prevents shorts to the substrate from the misaligned contact Referring to FIG. 8, photoresist layer 46 and remaining layer 44 are stripped to accommodate electrical connection of conductor 30 with some other circuit component. Alternately, layer 44 might remain and accordingly not be sacrificial. A representative application of this invention would be for use in connecting a second layer of polysilicon to a first layer of polysilicon on an integrated circuit. For example, a conductive layer of polysilicon could be deposited atop the FIG. 8 construction and patterned into a conductive line 50, as shown in FIG. 9. A more specific application of this invention would be for use in connection with processing methods of forming integrated circuitry memory devices such as DRAMs and SRAMs.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming a self-aligned contact opening comprising:

forming a conductor over a substrate, the conductor having an outer surface which is generally elevated relative to an immediately laterally adjacent substrate surface;

forming a first layer over the conductor and the adjacent substrate surface;

forming a second layer over the first layer; and removing portions of the first and the second layers to form a contact opening over the conductor outer surface, the removing being conducted to remove second layer material at a slower rate than first layer material.

2. The method of forming a self-aligned contact opening of claim 1, wherein the second layer has a non-uniform elevational thickness relative to the first layer.

3. The method of forming a self-aligned contact opening of claim 1, wherein the forming of a second layer comprises forming a mound of second layer material over the conductor.

4. The method of forming a self-aligned contact opening of claim 1, wherein at least some of the first and second layer portions are removed at the same time.

5. The method of forming a self-aligned contact opening of claim 1, wherein:

the conductor includes at least one sidewall edge which extends between the outer surface and the adjacent substrate surface; and the forming of a second layer comprises forming a mound of second layer material over the conductor.

6. The method of forming a self-aligned contact opening of claim 1, wherein the forming of a second layer comprises spin coating the second layer onto the substrate.

7. The method of forming a self-aligned contact opening of claim 1, wherein the second layer comprises a bottom anti-reflective coating material.

8. The method of forming a self-aligned contact opening of claim 1, wherein the second layer comprises spin-on-glass.

9. The method of forming a self-aligned contact opening of claim 1, wherein the second layer comprises polyimide material.

10. The method of forming a self-aligned contact opening of claim 1, wherein:

the conductor includes at least one sidewall edge which extends between the outer surface and the adjacent substrate surface;

forming a second layer comprises forming a mound of second layer material over the conductor; and the second layer comprises a bottom anti-reflective coating material.

11. The method of forming a self-aligned contact opening of claim 1, wherein:

the conductor includes at least one sidewall edge which extends between the outer surface and the adjacent substrate surface; and the forming of a second layer comprises spin coating the second layer onto the substrate, the second layer comprising a bottom anti-reflective coating material.

12. The method of forming a self-aligned contact opening of claim 1, wherein the removing consists essentially of etching the first and second layer portions using a common etch chemistry.

13. The method of forming a self-aligned contact opening of claim 1, wherein the removing comprises etching the first and second layer portions using at least two different etch chemistries.

14. The method of forming a self-aligned contact opening of claim 1 further comprising:

after the removing of the portions of the first and second layers, forming conductive material over the substrate and in electrical contact with the conductor.

15. The method of forming a self-aligned contact opening of claim 1 further comprising:

after the removing of the portions of the first and second layers, removing remaining second layer material; and forming conductive material over the substrate and in electrical contact with the conductor.

16. A method of forming a self-aligned contact opening comprising:

forming a conductor having a conductor target surface and at least one sidewall joined with the target surface and extending transversely away therefrom and toward an adjacent substrate surface;

covering the conductor with a dielectric material layer;

covering the dielectric material layer with a second material layer which is different from the dielectric material layer; and patterning and etching a contact opening at least to a portion of the conductor target surface, the etching removing the second layer material at a rate which is slower than a rate at which the dielectric layer material is removed.

17. The method of forming a self-aligned contact opening of claim 16, wherein the second material layer is formed to have a variable elevational thickness relative to the dielectric material layer.

18. The method of forming a self-aligned contact opening of claim 16, wherein the second material layer has an elevational thickness relative to the substrate surface at least a portion of which tapers toward the substrate surface laterally outward of the one sidewall.

19. The method of forming a self-aligned contact opening of claim 16, wherein the covering of the dielectric material layer with the second material layer comprises spin coating second material at least over the dielectric material layer laterally outward of the one sidewall, the second material layer having an elevational thickness relative to the substrate surface at least a portion of which tapers toward the substrate surface.

20. The method of forming a self-aligned contact opening of claim 16, wherein the second material layer comprises a bottom anti-reflective coating material.

21. The method of forming a self-aligned contact opening of claim 16, wherein:
the covering of the dielectric material layer with the second material layer comprises spin coating second material at least over the dielectric material layer laterally outward of the one sidewall, the second material layer having an elevational thickness relative to the substrate surface at least a portion of which tapers toward the substrate surface, the second material comprising a bottom anti-reflective coating material.

22. The method of forming a self-aligned contact opening of claim 16, wherein:
the step of covering the dielectric material layer with the second material layer comprises spin coating second material at least over the dielectric material layer laterally outward of the one sidewall;
the second material layer having an elevational thickness relative to the substrate surface at least a portion of which tapers toward the substrate surface, the second material comprising a bottom anti-reflective coating material; and
the patterning and etching comprising using two different etch chemistries to remove portions of the second material layer and dielectric layer.

23. A method of forming an integrated circuit comprising:
forming a conductor over a substrate, the conductor having a generally planar outer surface area supported elevationally outward of a substrate surface;
forming at least two layers over the conductor which are etchably different from one another, a first of the layers comprising an insulative material and a second of the layers comprising a bottom anti-reflective coating (BARC) material; and
electrically connecting a circuit component to the conductor through the two layers.

24. The method of forming an integrated circuit of claim 23, wherein the step of forming the second of the layers comprises spin coating the BARC material over the first of the layers to a non-uniform elevational thickness relative to the first of the layers.

25. The method of forming an integrated circuit of claim 23, wherein the planar outer surface area is supported by at least one substantially vertical sidewall.

26. The method of forming an integrated circuit of claim 23, wherein the first of the layers is formed to an elevational thickness over the conductor outer surface area of from about 50 Angstroms to about 5000 Angstroms.

27. The method of forming an integrated circuit of claim 23, wherein:
the first of the layers is formed to an elevational thickness over the conductor outer surface area of from about 50 Angstroms to about 5000 Angstroms; and
the step of forming the second of the layers comprises spin coating the BARC material over the first of the layers to a non-uniform elevational thickness relative to the first of the layers.

28. A method of forming a conductor assembly through which electrical connection is to be made comprising:
forming a conductive structure having at least one abrupt topological feature relative to a laterally adjacent substrate surface;
insulating the conductive structure with a generally conformal insulative material;
forming a generally non-conformal material over the insulative material, the non-conformal material defining an elevationally variable thickness laterally adjacent the at least one abrupt topological feature; and
electrically connecting a circuit component to the conductor through the generally conformal and non-conformal materials by removing portions of the insulative material and the non-conformal material, the non-conformal material being removed at a slower rate than the insulative material.

29. The method of forming a conductor assembly of claim 28, wherein the generally non-conformal material comprises a bottom anti-reflective coating material.

30. The method of forming a conductor assembly of claim 28, wherein the one abrupt topological feature is defined in part by a conductive surface which extends generally outwardly of and away from the laterally adjacent substrate surface.

31. The method of forming a conductor assembly of claim 28, wherein:
the one abrupt topological feature is defined in part by a conductive surface which extends generally outwardly of and away from the laterally adjacent substrate surface; and
the electrically connecting comprises electrically connecting conductive material with at least a portion of the conductive surface.

32. The method of forming a conductor assembly of claim 28, wherein the forming of a non-conformal material comprises spin coating the non-conformal material over the insulative material.

33. A method of forming a self-aligned contact opening comprising:
forming a conductor over a substrate, the conductor having an outer surface which is generally elevated relative to an immediately laterally adjacent substrate surface and which defines a width dimension in a width dimension direction;
forming a first electrically insulative layer over the conductor and the adjacent substrate surface;

forming a second layer over the first layer; and using a common chemistry removing portions of the first and the second layer to form a contact opening over the conductor outer surface, the contact opening having a lateral width dimension in the width dimension direction which is no less than the lateral width dimension of the conductor outer surface, the contact opening not extending to the adjacent substrate surface.

34. The method of forming a self-aligned contact opening of claim 33, wherein the second layer is formed from an electrically insulative material.

35. A method of forming a self-aligned contact opening comprising:

forming a conductor over a substrate, the conductor having an outer surface disposed between two spaced apart edges, the outer surface being generally elevated relative to an immediately laterally adjacent substrate surface, the conductor including at least one other conductor surface elevationally below at least one of the edges;

forming a first layer over the conductor and the adjacent substrate surface;

forming a second layer over the first layer; and removing portions of the first and the second layers to form a contact opening over the conductor outer surface, the removing exposing at least a portion of the one other conductor surface elevationally below the one edge and forming the contact opening to extend laterally outward beyond the one conductor outer surface edge, the contact opening not extending to the adjacent substrate surface.

36. The method of forming a self-aligned contact opening of claim 35, wherein the first and second layers are formed from different materials.

37. A method of forming a self-aligned contact opening comprising:

forming a conductor over a substrate, the conductor having opposing substantially vertical sidewalls which extend elevationally away from the substrate, and a generally planar target surface disposed laterally adjacent the sidewalls and supported therebetween, the target surface defining a conductor lateral width dimension in a desired width dimension direction;

forming a generally conformal layer of insulative material over the substrate and covering the conductor;

spin coating a generally non-conformal layer of bottom anti-reflective coating (BARC) material over the insulative material, the spin-coating forming a mound of BARC material over the conductor having an elevational thickness relative to a substrate outer surface at least a portion of which tapers toward the substrate outer surface laterally away from the conductor target surface; and forming a contact opening over less than all of the target surface by anisotropically etching portions of the insulative material and the BARC material which are disposed elevationally over the conductor target surface, the etching removing the insulative material at a faster rate than the BARC material, at least some of the insulative material and the BARC material being removed at the same time, the contact opening having a contact opening lateral width dimension in the same desired width dimension direction which is no less than the conductor lateral width dimension, the contact opening extending laterally outward beyond one of the conductor opposing sidewalls and not extending to the substrate over which the conductor is formed.

38. The method of claim 37, wherein the spin coating of the non-conformal layer comprises spin coating the layer to be thinner elevationally over the conductor than laterally outward of the conductor.

39. The method of claim 37 further comprising after the forming of the contact opening, removing remaining BARC material and forming conductive material to be in electrical contact with the conductor.

40. A method of forming a conductor assembly through which electrical connection is to be made comprising:

forming a conductive structure having at least one abrupt topological feature relative to a laterally adjacent substrate surface;

insulating the conductive structure with a generally conformal insulative material;

forming a generally non-conformal material comprising a bottom anti-reflective coating material over the insulative material, the non-conformal material defining an elevationally variable thickness laterally adjacent the at least one abrupt topological feature; and electrically connecting a circuit component to the conductor through the generally conformal and non-conformal materials.

* * * * *